(12) United States Patent
Theiler

(10) Patent No.: US 7,026,966 B2
(45) Date of Patent: Apr. 11, 2006

(54) DIGITAL-TO-ANALOG CONVERTER COMPRISING AN INTEGRATED TEST CIRCUIT

(75) Inventor: Helmut Theiler, Lieboch (AT)

(73) Assignee: Austriamicrosystems AG, Unterpremstatten (AT)

( * ) Notice: Subject to any disclaimer, the term of this patent is extended or adjusted under 35 U.S.C. 154(b) by 0 days.

(21) Appl. No.: 10/512,476

(22) PCT Filed: May 13, 2002

(86) PCT No.: PCT/AT02/00144

§ 371 (c)(1),
(2), (4) Date: Oct. 26, 2004

(87) PCT Pub. No.: WO03/096539

PCT Pub. Date: Nov. 20, 2003

(65) Prior Publication Data

US 2005/0162293 A1 Jul. 28, 2005

(51) Int. Cl.
*H03M 1/10* (2006.01)
*H03M 1/66* (2006.01)

(52) U.S. Cl. ...................... 341/120; 341/150

(58) Field of Classification Search .......... 341/144, 341/150, 118, 120, 163; 324/76.15, 120, 324/378, 765, 771, 76.12; 714/724, 738; 327/276

See application file for complete search history.

(56) References Cited

U.S. PATENT DOCUMENTS

| | | | |
|---|---|---|---|
| 4,023,098 A * | 5/1977 | Roth | 324/76.12 |
| 4,495,462 A * | 1/1985 | Weldon | 324/120 |
| 4,641,246 A | 2/1987 | Halbert et al. | 341/163 |
| 5,951,705 A * | 9/1999 | Arkin et al. | 714/738 |
| 5,977,893 A * | 11/1999 | Chen et al. | 341/120 |
| 5,999,008 A * | 12/1999 | Currin et al. | 324/765 |
| 6,121,811 A * | 9/2000 | Scott et al. | 327/276 |
| 6,175,939 B1 * | 1/2001 | Dinteman | 714/724 |
| 6,225,930 B1 * | 5/2001 | Felps | 341/144 |
| 6,320,528 B1 * | 11/2001 | Michel | 341/144 |
| 6,348,886 B1 * | 2/2002 | Frank et al. | 341/144 |
| 6,445,208 B1 * | 9/2002 | Sugamori | 324/771 |
| 6,492,798 B1 * | 12/2002 | Sunter | 324/76.15 |
| 6,570,385 B1 * | 5/2003 | Roberts et al. | 324/378 |
| 6,573,850 B1 * | 6/2003 | Pennock | 341/150 |
| 6,667,702 B1 * | 12/2003 | Sasaki et al. | 341/120 |

FOREIGN PATENT DOCUMENTS

| | | |
|---|---|---|
| SU | 1 494 216 | 7/1989 |
| WO | WO 01/29971 | 4/2001 |

* cited by examiner

*Primary Examiner*—Patrick Wamsley
(74) *Attorney, Agent, or Firm*—Nixon & Vanderhye P.C.

(57) ABSTRACT

In a digital-to-analog converter including an integrated test circuit, a digital input and an analog output, a comparator (5) capable of being connected with the analog output (4) and including a connection (7) for a reference voltage source, a digital test connection (11) and a logic element is provided, the logic element being connected with the test connection (11) for emitting the digital value 0 or 1 as a function of the difference between the voltage at the analog output (4) and the reference voltage.

9 Claims, 2 Drawing Sheets

DIGITAL-TO-ANALOG CONVERTER COMPRISING AN INTEGRATED TEST CIRCUIT

Figure 1:
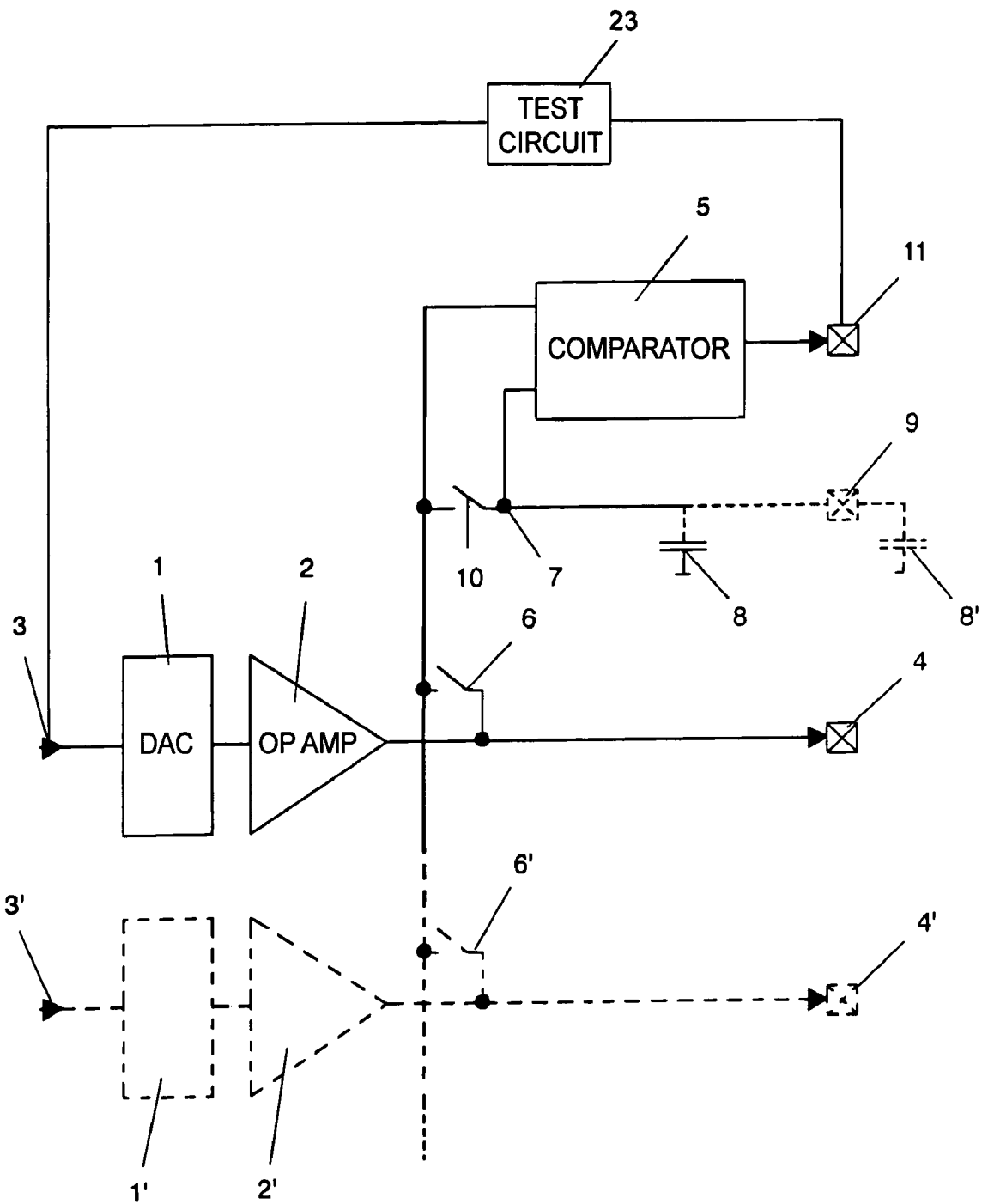

This application is the US national phase of international application PCT/AT02100144 filed 13 May 2002 which designated the U.S., the entire content of which is hereby incorporated by reference.

The invention relates to a digital-to-analog converter including an integrated test circuit, a digital input and an analog output.

Digital-to-analog converters (DACs) serve to convert a digital input code into the corresponding analog output voltage. The field of application is that of digital systems where rapid high-precision and high-resolution conversions are required.

In the vast majority of conventional DACs, the digital input code is fed to an analog switch matrix that generates binary-graduated partial streams via a resistive network. In a summation unit, all of said partial streams are added and optionally amplified so as to enable a voltage proportional to the applied input code to be tapped at the output. It is, therefore, basically distinguished between digital-to analog converters having a power output or a voltage output.

DACs require a great number of structural components. The resistance values have to be precisely matched with one another, whereby the drift behaviors are to be as identical as possible. The stray capacitance as well as switching delays of analog switches cause high transient voltage peaks. Since DACs that have low-impedance power outputs and optionally the input-code-dependent output resistance are hardly usable, output amplifiers are employed. This will, however, involve new error sources such as, e.g., offset voltage, inclination to overshooting, high pulse delay times.

Concerning digital-to-analog converters, distinction is basically made between static and dynamic characteristics. An important dynamic characteristic is the transient period, which indicates how long it takes at the most, after a shift of number Z from V to Z max, until the output signal has reached the stationary value with an accuracy of, e.g., ½ LSB (least significant bit). It is only then that the analog signal will be available with the accuracy provided by the resolution of the digital-to-analog converter. The reference to ½ LSB naturally implies that DACs having the same time constant will build up more slowly to ½ LSB at a higher resolution.

Digital-to analog converters having short transient periods are required in a number of instances. In the past, many DA converters primarily generated power which, on demand, was able to be converted into voltage using an "off-chip" resistance. The transient period of those DA converters is determined by the off-chip resistance and the capacitive load on the respective connection.

These days, voltage DACs by which the current can be converted into voltage by a consecutively arranged operational amplifier have been used to an increasing extent. In those instances, the transient period of the operational amplifier, which is in most cases clearly larger than that of the DA converter on account of the control loop, is added to the transient period of the DA converter itself. Converters of this type are able to substantially reduce power dissipation, yet call for a check of the transient period during the production process in any event. This will, however, involve problems if converters having transient periods in the order of some tens of nanoseconds are to be realized. It is, thus, the aim of the present invention to provide a digital-to-analog converter which includes an integrated test circuit by which the transient period of the DAC can be reliably measured, even if maximally permissible transient periods of some nanoseconds are to be observed. The integrated test circuit also will have to be able to measure the transient periods, even if an elevated number of DACs (16 or more) are to be realized in one unit.

To solve this object, the invention essentially consists in that a comparator capable of being connected with the analog output and comprising a connection for a reference voltage source, a digital test connection and a logic element is provided, said logic element being connected with the test connection for emitting the digital value 0 or 1 as a function of the difference between the voltage at the analog output and the reference voltage. Due to the fact that the analog output of the digital-to-analog converter is now capable of being connected with a comparator, it has become feasible to compare the analog voltage value supplied by the DAC with an appropriate reference value. In accordance with the invention, the comparator to this end comprises a connection for a reference voltage source, wherein a digital test connection and a logic element are further provided, said logic element being connected with the test connection for omitting the digital value 0 or 1 as a function of the difference between the voltage at the analog output and the reference voltage. The logic element of the comparator ion this case cooperates with the test connection value in a manner that the switching state of the test connection will change, if the difference determined by the comparator, between the voltage at the analog output and the reference voltage becomes smaller than the transient tolerance (e.g., ½ LSB). Since the reference voltage source corresponds to the analog target value of the digital word applied to the input of the DAC, the transient period of the DACs can be determined in a simple manner by the aid of an external test device that operates exclusively digitally. To this end, the time between the application of the digital word to the input of the digital-to-analog converter and the time at which the window comparator displays a stable equality result at the digital test connection are measured by the external test device. The test device, thus functions exclusively on the basis of a digital pattern test (yes/no), that can be realized in a very simple manner by common digital test systems. It is, thus, essential to the invention that the comparator comprises a digital test connection, since transient periods even in the order of some nanoseconds will be detected by the digital mode of operation of the test device.

In a preferred manner, the connection for the reference voltage source is connected with the analog output via a switch. In this manner, the connection for the reference voltage source is directly connected with the analog value corresponding to the digital test word such that if, for instance, the reference voltage source is comprised of a capacitor, as in correspondence with a preferred further development of the invention, the desired reference voltage will be immediately available and, for instance, stored in a capacitor. If the switch is opened, the respective reference voltage will be immediately available to the comparator. As already mentioned, the digital-to-analog converter may be designed as a power DA converter comprising a consecutively arranged operational amplifier. A particularly advantageous configuration will result if the digital-to-analog converter, the comparator and optionally the capacitor are designed as an integrated circuit. The integrated test circuit can, thus, be designed as an on-chip configuration and integrated in an integrated circuit. This ensures a particularly compact design, whereby the transient period of the digitalto-analog converter is effected in a simple manner externally via the digital test connection.

As already pointed out, the reference voltage source, i.e., for instance the capacitor, can be arranged on-chip such that the reference voltage will be immediately available within the integrated circuit and need not be supplied from outside. The advantage of storing the DAC output voltage at a capacitor and generating the reference voltage in this manner resides in that the reference voltage is practically free of errors in respect to the build up DAC output voltage. If a larger number of DACs is integrated in one unit, the measuring unit (window comparator plus VREF storage capacity) can be sequentially used to test all of the DACs.

The invention also relates to a method for determining the transient period of a digital-to-analog converter, which is essentially characterized by the steps of:

applying to the input of the digital-to-analog converter a digital word corresponding to a stored analog target value, comparing the analog signal at the output of the digital-to-analog converter with the stored analog target value, generating a digitally evaluatable signal as soon as the difference between the analog signal at the output of the digital-to-analog converter and the stored analog target value has become smaller than the transient tolerance (e.g. 1 LSB), measuring the time between the application of the digital word to the input of the digital-to-analog converter and the generation of the digitally evaluatable signal.

Thus, a digital word is initially applied to the input of the digital-to-analog converter, said digital word corresponding to an analog target value. As already mentioned, the storage of the analog target value can, for instance, be implemented by charging a capacitor with the analog voltage at the DAC output. The transient period of a DAC voltage value can then be realized at the previously stored target value, whereby a digital signal will signal when the difference between the analog signal and the stored analog target value has become smaller than the transient tolerance. In the simplest case, the digitally evaluatable signal is comprised of the state 0 or 1 of a digital test connection. In accordance with the invention, the measurement proper of the transient period is exclusively effected digitally, with the transient period corresponding to the time between the application of the digital word to the input of the digital-to-analog converter and the generation of the digitally evaluatable signal.

In the following, the invention will be explained in more detail by way of an exemplary embodiment of a digital-to-analog converter schematically illustrated in the drawing. Therein, FIG. 1 is a block diagram of the digital-to-analog converter including an integrated test circuit, and FIG. 2 shows the states of the individual connections.

Figure 2:
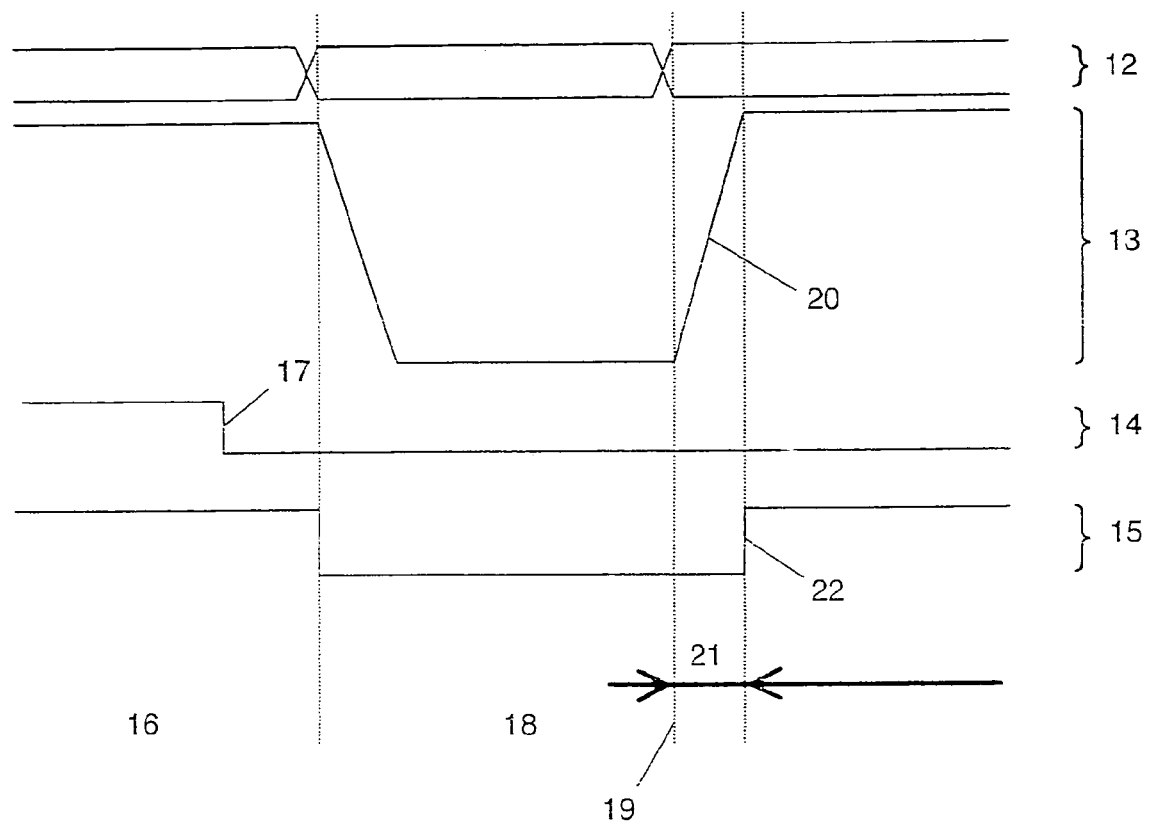

FIG. 1 depicts a digital-to-analog converter 1 comprising a consecutively arranged operational amplifier 2. The digital input of the digital-to-analog converter 1 is denoted by 3. The analog output of the digital-to-analog converter is denoted by 4, a comparator 5 being connected with the output 4 via a switch 6. The comparator 5 comprises a connection 7 for a capacitor 8 arranged on-chip. The connection 7 may, however, be connected with an external capacitor 8' via a connection 9, as illustrated in broken lines. Furthermore, a switch 10 is provided, via which the capacitor 8 or 8', respectively, can be connected with the analog output 4 of the digital-to-analog converter. The digital test connection of the comparator 5 is denoted by 11. As indicated in broken lines, additional converter stages 1', 2' may be provided, which are connectable to the comparator 5 and the entire test circuit via a switch 6'.

In order to measure the transient period of the digital-to-analog converter, it will be operated in the following manner: At first, a digital word corresponding to an analog target voltage is applied to the digital-to-analog converter to be tested. To store as a reference voltage the target voltage output by the DAC, switches 6 and 10 are closed and said voltage is, thus, stored in the capacitor 8, whereupon switch 10 is opened. The individual switching states are illustrated in more detail in FIG. 2, the digital code applied to the digital connection 3 being visible in region 12, the voltage at the analog output 4 being visible in region 13, the state of the switch 10 being visible in region 14 and the state of the digital test connection 11 being visible in region 15. In the first temporal portion 16 of the test procedure, the capacitor 8 is charged with the reference voltage as already mentioned, whereupon the switch 10 is opened as indicated by step 17. This causes the reference voltage to remain stored in the capacitor 8. In the subsequent time range 18, another digital code is applied to the digital connection 3 such that the voltage at the connection 4 will change too. This causes the test connection 11 to assume another switching state, since the difference between the voltage stored in the capacitor 8 and the voltage at the analog output 4 is larger than the transient tolerance. The measuring procedure proper starts at time 19. The original digital target code is again applied to the digital connection 3 of the digital-to-analog converter 1, whereupon the initial voltage of the DAC 1 will build up to the analog target value after a certain period of time, which is characterized by flank 20. The respective transient period is denoted by 21. During the transient period, the comparator 5 compares the difference between the reference voltage stored in the capacitor 8 and the voltage at the analog output 4, and as soon as this difference has become smaller than the transient tolerance, the switching state of the digital test connection 11 changes as illustrated by step 22. This causes an external measuring device to recognize that the voltage at the output 4 has reached the target voltage and the transient procedure is completed.

Overall, the digital-to-analog converter is, thus, equipped with a test circuit 23 which allows for in a simple manner the completely digital measurement of the transient period, and hence also the reliable measurement of transient periods ranging in the order of some nanoseconds. The entire test circuit, that incorporates a conventional time measurement device, is arranged on-chip, and it is, therefore, feasible to carry out a reliable measurement already during the production process in order to immediately remove from the production line those DA converters which do not correspond to the required transient period values.

The invention claimed is:

1. A digital-to-analog converter including an integrated test circuit, a digital input and an analog output, characterized in that a comparator capable of being connected with the analog output and comprising a connection for a reference voltage source, a digital test connection and a logic element is provided, said logic element being connected with the test connection for emitting the digital value 0 or 1 as a function of the difference between the voltage at the analog output and the reference voltage.

2. A digital-to-analog converter according to claim 1, characterized in that the connection for the reference voltage source is connected with the analog output via a switch.

3. A digital-to-analog converter according to claim 1 or 2, characterized in that the reference voltage source is comprised of a capacitor.

4. A digital-to-analog converter according to claim 3, characterized in that the digital-to-analog converter is designed as a power DAC converter comprising a consecutively arranged operational amplifier.

5. A digital-to-analog converter according to claim 3, characterized in that the digital-to-analog converter, the comparator and the capacitor are designed as an integrated circuit.

6. A digital-to-analog converter according to claim 1 or 2, characterized in that the digital-to-analog converter is designed as a power DAC converter comprising a consecutively arranged operational amplifier.

7. A digital-to-analog converter according to claim 6, characterized in that the digital-to-analog converter, the comparator and the capacitor are designed as an integrated circuit.

8. A digital-to-analog converter according to claim 2, characterized in that the digital-to-analog converter and the comparator are designed as an integrated circuit.

9. A method for determining the transient period of a digital-to-analog converter, characterized by the steps of:

applying to the input of the digital-to-analog converter a digital word corresponding to a stored analog target value, comparing the analog signal at the output of the digital-to-analog converter with the stored analog target value, generating a digitally evaluatable signal as soon as the difference between the analog signal at the output of the digital-to-analog converter and the stored analog target value has become smaller than the transient tolerance, and measuring the time between the application of the digital word to the input of the digital-to-analog converter and the generation of the digitally evaluatable signal.

* * * * *